United States Patent [19]
Bhansali

[11] Patent Number: 5,886,406
[45] Date of Patent: *Mar. 23, 1999

[54] POWER-GROUND PLANE FOR A C4 FLIP-CHIP SUBSTRATE

[75] Inventor: Ameet Bhansali, Freemont, Calif.

[73] Assignee: Intel Corporation, Santa Clara, Calif.

[*] Notice: The term of this patent shall not extend beyond the expiration date of Pat. No. 5,708,296.

[21] Appl. No.: 946,415

[22] Filed: Oct. 7, 1997

Related U.S. Application Data

[63] Continuation of Ser. No. 669,620, Jun. 24, 1996, Pat. No. 5,708,296.
[51] Int. Cl.⁶ ................................................. H01L 23/04
[52] U.S. Cl. .......................... 257/698; 257/700; 257/691
[58] Field of Search ..................................... 257/698, 700, 257/691, 723, 724, 775

[56] References Cited

U.S. PATENT DOCUMENTS 4,667,219  5/1987  Lee et al. .
5,099,388  3/1992  Ogawa et al. .
5,450,290  9/1995  Boyko et al. .
5,538,433  7/1996  Arisaka .
5,708,296  1/1998  Bhansali .

Primary Examiner—Mahshid D. Saadat
Assistant Examiner—S. V. Clark
Attorney, Agent, or Firm—Blakely, Sokoloff, Taylor & Zafman LLP

[57] ABSTRACT

A package for an integrated circuit that contains a plurality of small circular dielectric spaces which separate vias from a conductive plane of the package. The package has a first internal conductive plane, a second internal conductive plane and a plurality of bond pads located on a top surface of a substrate. The substrate has a plurality of vias that extend through the first conductive plane to couple the second conductive plane to the bond pads. The package has a plurality of concentric dielectric clearance spaces that separate the vias from the first conductive plane. The small concentric spaces optimize the area of the conductive plane to minimize the resistance and maximize the capacitance of the package.

16 Claims, 3 Drawing Sheets

POWER-GROUND PLANE FOR A C4 FLIP-CHIP SUBSTRATE This is a Continuation Application of application Ser. No. 08/669,620, filed Jun. 24, 1996, now U.S. Pat. No. 5,708,296.

BACKGROUND OF THE INVENTION

1. Field of the Invention

The present invention relates to a package for an integrated circuit.

2. Description of Related Art

Integrated circuits are typically housed within a package that is soldered to a printed circuit board. The package typically has a plurality of bond pads that are connected to corresponding output pads of the integrated circuit. The bond pads are coupled to external package contacts by internal power/ground planes, signal routing traces and vias. The vias interconnect the bond pads and contacts to the various internal routing layers within the substrate of the package.

FIG. 1 shows a power/ground plane 2 of the prior art which has a plurality of vias 4 that provide interconnect to other layers of the package. The plane 2 has a large central opening 6 of dielectric material which separates the vias 4 from the conductive buss material. The dielectric space prevents the vias from shorting to the conductive plane. The plane may contain traces 8 that couple some of the vias 4 to the power/ground buss.

The internal routing of the package creates switching noise that limits the speed of the integrated circuit. The switching noise can be particularly critical to a highly functional integrated circuit such as a microprocessor. It is therefore desirable to minimize the switching noise created by the substrate.

Switching noise is a function of the effective inductance and capacitance of the substrate. Noise will decrease with an increase in the substrate capacitance. The large dielectric opening increases the resistance and decreases the capacitance of the package. It is desirable to provide a flip chip package which increases the capacitance and minimizes the noise created by the package.

SUMMARY OF THE INVENTION

The present invention is a package for an integrated circuit that contains a plurality of small circular dielectric spaces which separate vias from a conductive plane of the package. The package has a first internal conductive plane, a second internal conductive plane and a plurality of bond pads located on a top surface of a substrate. The substrate has a plurality of vias that extend through the first conductive plane to couple the second conductive plane to the bond pads. The package has a plurality of concentric dielectric clearance spaces that separate the vias from the first conductive plane. The small concentric spaces optimize the area of the conductive plane to minimize the resistance and maximize the capacitance of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
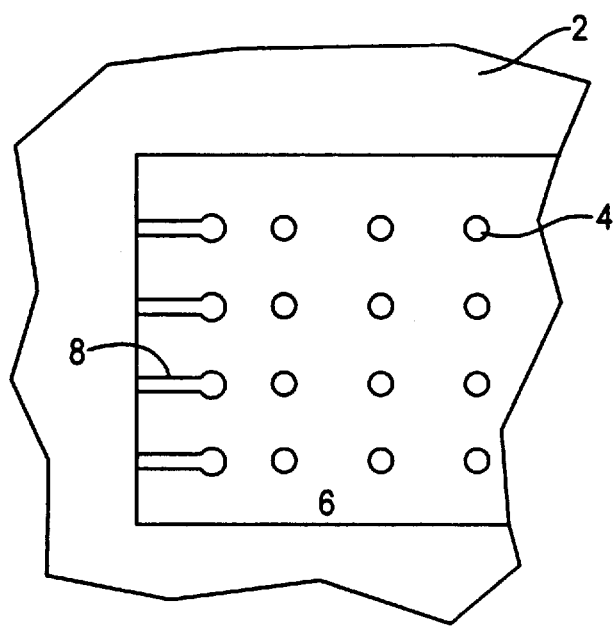
FIG. 1 is a top sectional view showing a conductive plane of a prior art substrate.
Figure 2:
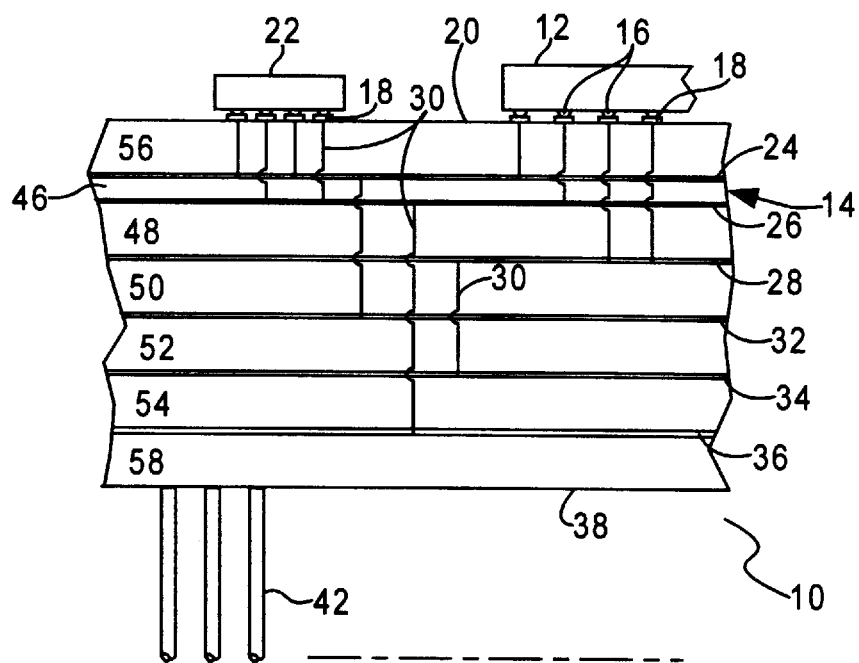
FIG. 2 is a side sectional view of a substrate of the present invention.

Referring to the drawings more particularly by reference numbers, FIG. 2 shows an integrated circuit package 10 of the present invention. The package 10 includes an integrated circuit 12 that is mounted to a substrate 14. The integrated circuit 12 is preferably a microprocessor. Although an integrated circuit 12 is shown and described, it is to be understood that the package 10 may contain any electrical device. The substrate 14 is typically constructed from co-fired ceramic processes known in the art, although it is to be understood that the substrate 14 may be constructed with other known packaging materials and processes. By way of example, the substrate 14 may be constructed as a printed circuit board.

The integrated circuit 12 has a number of solder bumps 16 that are soldered to corresponding contact pads 18 located on a top surface 20 of the substrate 14. An integrated circuit directly mounted to a substrate is commonly referred to as a "flip chip" or "C4" package and is known in the art. The package 10 may also have one or more capacitors 22 mounted to corresponding contact pads 18 of the substrate 14. The capacitors 22 typically filter the power provided to the integrated circuit 12. Although a flip chip package is shown and described, it is to be understood that the present invention may be utilized in other types of integrated circuit packages.

The substrate 14 has a first power plane 24, a first ground plane 26 and a first layer of signal routing traces 28 that are coupled to the capacitors 22 and integrated circuit 12 by a plurality of vias 30. The substrate 14 may also have a second power plane 32, a second layer of signal routing traces 34 and a second ground plane 36 located between the first ground plane 26 and a bottom surface 38 of the substrate 14. The second power plane 32 and second ground plane 36 are coupled to the first power plane 24 and the first ground plane 26, respectively, by a plurality of vias 30. Likewise, the second layer of signal routing traces 34 is coupled to the first layer of routing traces 28 by vias 30.

Figure 3:
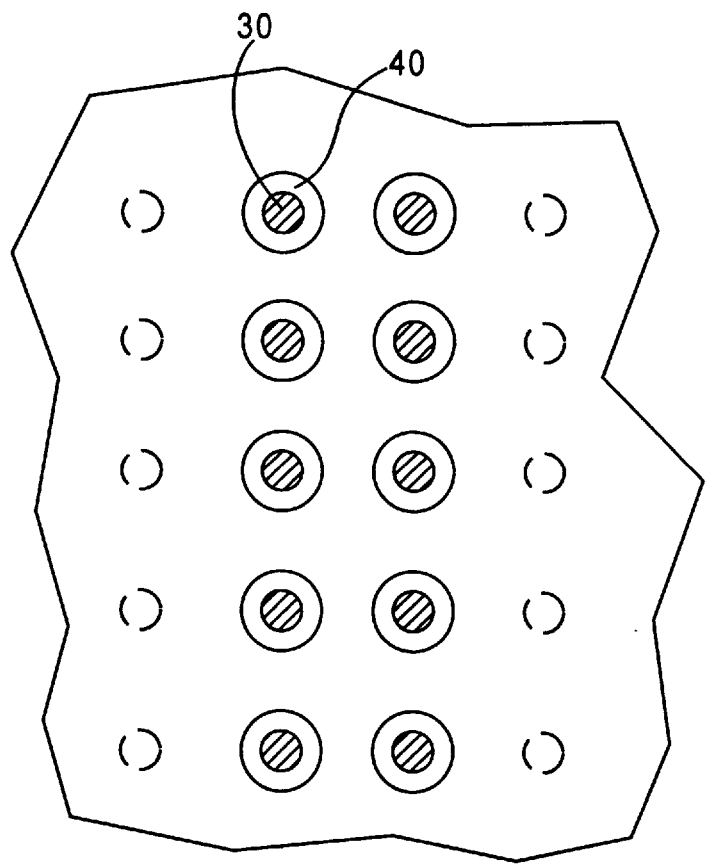
FIG. 3 is a top sectional view of a conductive plane of the substrate.

As shown in FIG. 3, the vias 30 are typically arranged in a two dimensional array across the power and ground planes 24, 26, 32 and 34. Some of the vias 30 are connected directly to the conductive planes. The remaining vias 30 are separated from the conductive busses by dielectric spaces 40. The dielectric spaces 40 prevent an electrical shorting between the vias 30 and the conductive planes. The spaces 40 are preferably circular and concentric with the vias 30. In the preferred embodiment the vias 30 are typically 2–8 mils in diameter and the spaces are no more than 2–5 mils in diameter. The dielectric spaces create a "swiss cheese" appearance which optimizes the area of each conductive plane. Optimizing the conductive plane area minimizes the resistance and maximizes the capacitance of the package, thereby providing favorable impedance characteristics.

The second power plane 32, second ground plane 36 and second layer of signal routing traces 34 are coupled to a plurality of pins 42 that extend from the bottom surface 38 of the substrate 14. The pins 42 are typically mated with a corresponding socket (not shown) that is mounted to an external printed circuit board (not shown). Alternatively, the pins 42 may be soldered directly to the external printed circuit board. The pins 42 that are coupled to the power and ground planes of the substrate are connected to the power and ground busses of the external printed circuit board to provide power to the integrated circuit 12. The pins 42 that are coupled to the routing traces of the substrate are connected to digital signal lines of the external circuit board to provide signals to the integrated circuit. Although pins 42 are shown and described, it is to be understood that the package may have other types of external contacts such as solder balls.

The substrate 14 is constructed to minimize the switching noise of the integrated circuit 12. Switching noise is proportional to the square of the electrical frequency (Wo) and the inverse of the capacitance (1/C) of the electrical path. To reduce switching noise it is desirable to increase the capacitance C. The swiss cheese arrangement of dielectric spaces 40 provides a maximum conductive plane area which maximizes the capacitance and reduces the noise created by the package.

The first power plane 24 is separated from the first ground plane 26 by a first dielectric space 46. The first layer of signal routing spaces 28 is separated from the first ground plane 26 by a second dielectric space 48. The second power plane 32 is separated from the first layer of signal routing traces 28 by a third dielectric space 50. The second layer of signal routing traces 34 is separated from the second power plane 32 by a fourth dielectric space 52. The second ground plane 36 is separated from the second layer of signal routing traces 34 by a fifth dielectric space 54. The first power plane 24 and second ground plane 36 are separated from the top 20 and bottom 38 surfaces by sixth 56 and seventh 58 dielectric spaces, respectively.

The first dielectric space 46 has a width that is less than widths of the other dielectric spaces 48–58. The relatively narrow first dielectric space 46 increases the capacitance and mutual inductance between the first power 24 and ground 26 planes. The higher capacitance and mutual inductance decrease the switching noise of the integrated circuit. In the preferred embodiment, the width of the first dielectric space 46 is 0.002 inches and the widths of the second, third, fourth, fifth, sixth and seventh dielectric spaces are each 0.008 inches.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a substrate that has a first conductive plane, a second conductive plane, a layer of signal routing traces and a plurality of bond pads located on a top surface of said substrate, said first conductive plane being separated from said second conductive plane by a first dielectric space and said layer of signal routing traces being separated from said second conductive plane by a second dielectric space that has a width which is greater than a width of said first dielectric space, said substrate having a plurality of vias that extend through said first conductive plane and couple said second conductive plane with said bond pads, said substrate further having a plurality of clearance spaces that separate said vias from said first conductive plane.

2. The package as recited in claim 1, wherein said substrate has a plurality of vias that extend through said second conductive plane to connect said first conductive plane to a third conductive plane wherein said vias are separated from said second conductive plane by a plurality of circular clearance spaces.

3. The package as recited in claim 2, wherein said substrate has a plurality of vias that connect said first conductive plane to said bond pads.

4. The package as recited in claim 1, wherein said substrate has a layer of signal routing traces that are coupled to said bond pads by said vias.

5. The package as recited in claim 3, further comprising a capacitor that is mounted to said top surface of said substrate and coupled to said first and second conductive planes.

6. The package as recited in claim 3, wherein said first conductive plane is dedicated to electrical power and said second conductive plane is dedicated to electrical ground.

7. The package as recited in claim 1, wherein said vias are arranged in a two dimensional array of rows and columns.

8. An electronic package, comprising:

a substrate that has a first conductive plane, a second conductive planes layer of signal routing traces and a plurality of bond pads located on a top surface of said substrate, said first conductive plane being separated from said second conductive plane by a first dielectric space and said layer of signal routing traces being separated from said second conductive plane by a second dielectric space that has a width which is greater than a width of said first dielectric space, said substrate having a plurality of vias that extend through said first conductive plane and couple said second conductive plane with said bond pads, said substrate further having a plurality of clearance spaces that separate said vias from said first conductive plane; and, an integrated circuit that is mounted to said top surface of said substrate.

9. The package as recited in claim 8, wherein said substrate has a plurality of vias that extend through said second conductive plane to connect said first conductive plane to a third conductive plane wherein said vias are separated from said second conductive plane by a plurality of circular clearance spaces.

10. The package as recited in claim 9, wherein said substrate has a plurality of vias that connect said first conductive plane to said bond pads.

11. The package as recited in claim 8, wherein said substrate has a layer of signal routing traces that are coupled to said bond pads by said vias.

12. The package as recited in claim 10, further comprising a capacitor that is mounted to said top surface of said substrate and coupled to said first and second conductive planes.

13. The package as recited in claim 10, wherein said first conductive plane is dedicated to electrical power and said second conductive plane is dedicated to electrical ground.

14. The package as recited in claim 8, wherein said vias are arranged in a two dimensional array of rows and columns.

15. A package as recited in claim 1, wherein the clearance spaces each have a circular shape.

16. A package as recited in claim 8, wherein the clearance spaces each have a circular shape.

* * * * *